United States Patent
Ok et al.

(10) Patent No.: US 11,282,947 B1
(45) Date of Patent: Mar. 22, 2022

(54) HETEROJUNCTION BIPOLAR TRANSISTOR WITH A SILICON OXIDE LAYER ON A SILICON GERMANIUM BASE

(71) Applicant: INTERNATIONAL BUSINESS MACHINES CORPORATION, Armonk, NY (US)

(72) Inventors: Injo Ok, Loudonville, NY (US); Alexander Reznicek, Troy, NY (US); Choonghyun Lee, Rensselaer, NY (US); Soon-Cheon Seo, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/009,831

(22) Filed: Sep. 2, 2020

(51) Int. Cl.
| | |
|---|---|
| *H01L 29/737* | (2006.01) |
| *H01L 29/66* | (2006.01) |
| *H01L 29/165* | (2006.01) |
| *H01L 29/08* | (2006.01) |
| *H01L 29/10* | (2006.01) |

(52) U.S. Cl.
CPC ...... *H01L 29/7371* (2013.01); *H01L 29/0817* (2013.01); *H01L 29/0821* (2013.01); *H01L 29/1004* (2013.01); *H01L 29/165* (2013.01); *H01L 29/66242* (2013.01); *H01L 29/66969* (2013.01)

(58) Field of Classification Search
CPC ........... H01L 29/7371; H01L 29/66969; H01L 29/165; H01L 29/0817; H01L 29/1004
See application file for complete search history.

(56) References Cited

U.S. PATENT DOCUMENTS

| | | | |
|---|---|---|---|
| 7,985,959 B2 | 7/2011 | Magistretti | |
| 8,617,957 B1 | 12/2013 | Chang | |
| 9,209,095 B2 | 12/2015 | Chang | |
| 9,520,469 B1 | 12/2016 | Balakrishnan | |
| 9,525,027 B2 | 12/2016 | Hashemi | |
| 10,115,800 B1 | 10/2018 | Kim | |
| 10,332,999 B1 | 6/2019 | Cheng | |
| 2018/0026101 A1 | 1/2018 | Jagannathan | |
| 2019/0097022 A1* | 3/2019 | Kim | H01L 21/2252 |
| 2019/0181236 A1* | 6/2019 | Lee | H01L 21/76897 |
| 2019/0312126 A1* | 10/2019 | Shiu | H01L 29/0657 |

\* cited by examiner

*Primary Examiner* — Syed I Gheyas
(74) *Attorney, Agent, or Firm* — L. Jeffrey Kelly

(57) ABSTRACT

A heterojunction bipolar transistor may include a base epitaxially grown on a collector, an emitter epitaxially grown on the base, the emitter and the base being patterned into a fin, and a silicon oxide layer formed on sidewalls of the fin, the silicon oxide layer separating the base from a spacer. The heterojunction bipolar transistor may include the spacer formed on top of the silicon oxide layer and an interlayer dielectric formed on top of the spacer. The heterojunction bipolar transistor may also include a silicon germanium oxide layer formed on sidewalls of the base. The base may be made of silicon germanium. The emitter and the collector may be made of silicon. The base may be doped with a p-type dopant. The emitter and the collector may be doped with a n-type dopant.

12 Claims, 8 Drawing Sheets

HETEROJUNCTION BIPOLAR TRANSISTOR WITH A SILICON OXIDE LAYER ON A SILICON GERMANIUM BASE

BACKGROUND

The present invention relates generally to a semiconductor structure and a method of forming the same. More particularly, the present invention relates to a semiconductor structure that includes a heterojunction bipolar transistor (HBT) with a silicon oxide layer on a silicon germanium base.

Heterojunction bipolar transistors (HBTs) is a promising technology element positioned to meet the performance needs of Bipolar CMOS technology for optical and radio-frequency (RF) applications. HBTs may be included in high-speed devices based on narrow-bandgap semiconductor materials. HBTs may also be included in high-voltage devices based on wide-bandgap semiconductor materials.

SUMMARY

According to one embodiment of the present invention, a semiconductor structure is provided. The semiconductor structure may include a heterojunction bipolar transistor. The heterojunction bipolar transistor may include a base epitaxially grown on a collector, an emitter epitaxially grown on the base, the emitter and the base being patterned into a fin, and a silicon oxide layer formed on sidewalls of the fin, the silicon oxide layer separating the base from a spacer. The heterojunction bipolar transistor may include the spacer formed on top of the silicon oxide layer and an interlayer dielectric formed on top of the spacer. The heterojunction bipolar transistor may also include a silicon germanium oxide layer formed on sidewalls of the base. The base may be made of silicon germanium. The emitter and the collector may be made of silicon. The base may be doped with a p-type dopant. The emitter and the collector may be doped with a n-type dopant.

According to another embodiment of the present invention, a semiconductor structure is provided. The semiconductor structure may include a heterojunction bipolar transistor. The heterojunction bipolar transistor may include a base epitaxially grown on a collector, an emitter epitaxially grown on the base, the emitter and the base being patterned into a fin, and an epitaxy layer epitaxially grown on sidewalls of the fin, the epitaxy layer is made of silicon. The epitaxy layer may be formed into a silicon oxide layer. The base may be made of silicon germanium. The emitter and the collector may be made of silicon. The base may be doped with a p-type dopant. The emitter and the collector may be doped with a n-type dopant.

According to another embodiment of the present invention, a method is provided. The method may include forming a heterojunction bipolar transistor by epitaxially growing a base on a collector, epitaxially growing an emitter on the base, the emitter and the base being patterned into a fin, and epitaxially growing an epitaxy layer on sidewalls of the fin, the epitaxy layer is made of silicon. The method may include chemically oxidizing the epitaxy layer to form a silicon oxide layer, forming spacers on top of the silicon oxide layer, and depositing an interlayer dielectric on top of the spacers. The base may be made of silicon germanium. The emitter and the collector may be made of silicon. The base may be doped with a p-type dopant. The emitter and the collector may be doped with a n-type dopant. The epitaxy layer may be made of silicon.

BRIEF DESCRIPTION OF THE DRAWINGS

The following detailed description, given by way of example and not intend to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
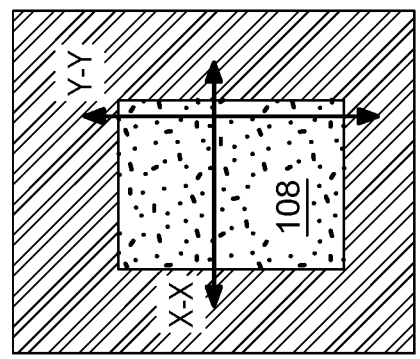
FIG. 1 is a cross section view illustrating an emitter, a base, and a collector in accordance with an embodiment.
Figure 1:
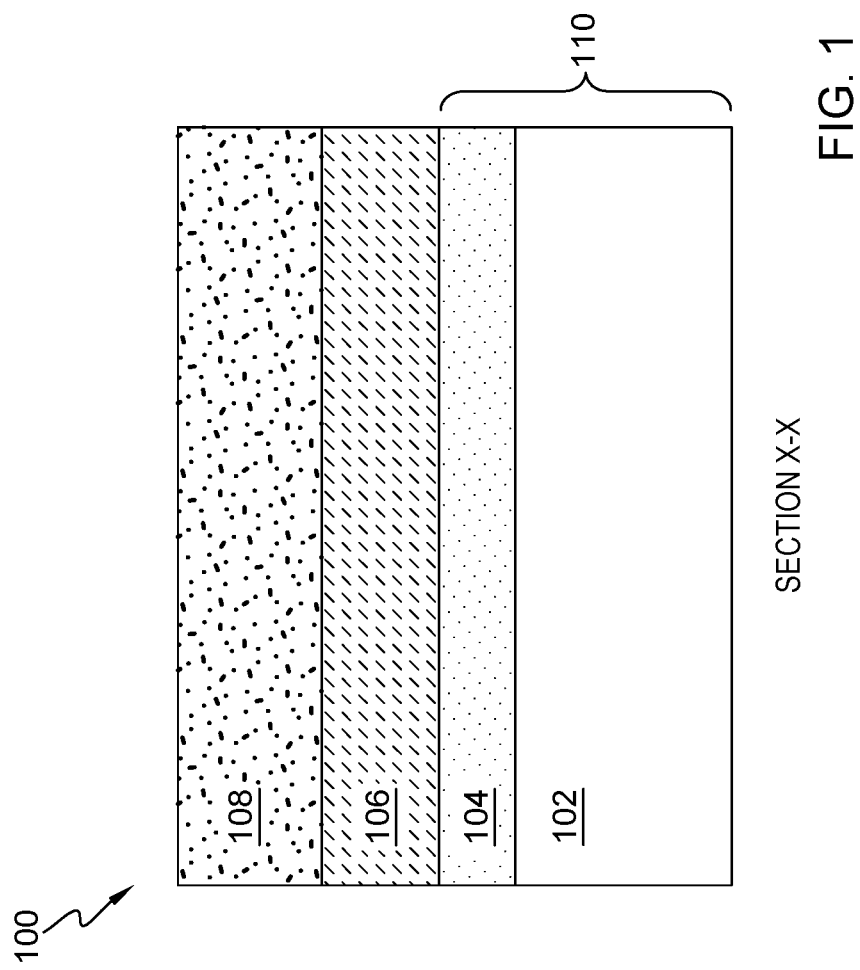

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to a semiconductor structure and a method of forming the same. More particularly, the present invention relates to a semiconductor structure that includes a heterojunction bipolar transistor (HBT) with a silicon oxide layer on a silicon-germanium base.

An HBT is a type of a bipolar junction transistor that uses different semiconductor materials for an emitter and base regions, creating a heterojunction, an interface that occurs between two layers of dissimilar semiconductors having unequal band gaps. The HBT may handle signals of very high frequencies and may be used in modern ultrafast circuits, mostly radio-frequency (RF) systems, and in applications requiring a high power efficiency.

A conventional HBT device may include a silicon-germanium (SiGe) base surrounded by a dielectric fill, thus creating a SiGe and dielectric interface. This interface has a relatively high interface trap charge, generating surface-state currents without base control. More particularly, the SiGe base includes uncontrolled charges. As a result, even when the device is turned off, the interface states between the SiGe base and the dielectric create a current that continues to flow, making the device undesirable. As such, there exists a need to form HBTs that include SiGe bases but have low interface trap densities at the SiGe base.

Embodiments of the present invention propose a fin-type heterojunction bipolar transistor with a silicon oxide layer on the SiGe base. More particularly, embodiments of the present invention propose using selective germanium oxide (GeOx) scavenging method to remove the GeOx from the silicon-germanium-oxide (SiGeOx) formed on the SiGe base, thus reducing the surface-states and associated leakage currents caused by the surface/interface states. Embodiments of the present invention provide a high-quality interface at the SiGe base by depositing or growing a silicon epitaxy layer onto the SiGe base followed by chemical oxidation of the silicon epitaxy layer. Further, embodiments of the present invention help in lateral and vertical scaling and may be used to achieve smaller and faster SiGe HBTs with greatly increased current densities.

The present invention relates generally to a semiconductor structure and a method of forming the same. More particularly, the present invention relates to a semiconductor structure that includes a heterojunction bipolar transistor (HBT) with a silicon oxide layer on a silicon germanium base. Ideally, reducing the interface states at the silicon germanium and silicon oxide interface will improve device performance by reducing current leakage. One way to reduce interface states between the silicon germanium base and the silicon oxide may include using selective germanium oxide (GeOx) scavenging method to remove the GeOx from the silicon-germanium-oxide (SiGeOx) formed on the SiGe base. Doing so will eliminate the interface-state leakage current. One embodiment by which to fabricate the HBT with a silicon oxide layer on a silicon-germanium base is described in detail below by referring to the accompanying drawings FIGS. 1-6. In the present embodiment, selective germanium oxide (GeOx) scavenging method is used to remove the GeOx from the silicon-germanium-oxide (SiGeOx) formed on the SiGe base, thus reducing the SiGe/SiO2 interface.

FIGS. 1-8 illustrate exemplary method steps of forming a HBT with a silicon oxide layer on a silicon-germanium base as well as an HBT structure, in accordance with an embodiment. FIG. 1 is a cross section view taken along section line X-X. FIGS. 2-8 are cross section views taken along section line X-X and section Y-Y. Section line X-X is perpendicular to the fins whereas section Y-Y is parallel to the fins.

Referring now to FIG. 1, a structure 100 is shown, in accordance with an embodiment. The structure 100 may include a first silicon layer 102, a second silicon layer 104, a base 106, and an emitter 108. The first silicon layer 102 may be formed by implanting it onto the substrate using arsenic or phosphorus. The first silicon layer 102 may also be epitaxially grown and in-situ doped on a substrate (not shown), such as, for example, a silicon wafer. The first silicon layer 102 may be grown using a suitable growth process, for example, chemical vapor deposition (CVD), low pressure chemical vapor deposition (LPCVD) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

The first silicon layer 102 may be grown to a thickness ranging between 10 nanometers (nm) to about 100 nm, or about 100 nm to about 1000 nm, although other thicknesses are also contemplated. In an embodiment, the first silicon layer 102 may be heavily doped with a dopant, which may be an n-type dopant, such as, for example, antimony, arsenic, or phosphorus. In an alternative embodiment, the first silicon layer 102 may be doped with a p-type dopant, such as, for example boron, or gallium. The dopant level in the first silicon layer 102 is in a range from about 1E20 atoms/cm3 to about 8E20 atoms/cm3.

Once the first silicon layer 102 is grown to a desired thickness, the second silicon layer 104 is then grown on the top surface of the first silicon layer 102. The second silicon layer 104 may be grown using similar techniques used to grow the first silicon layer 102. The second silicon layer 104 is doped with the same dopant as the first silicon layer 102. For example, when the first silicon layer 102 is doped with an n-type dopant, then the second silicon layer 104 is doped with the same n-type dopant. The first silicon layer 102 and the second silicon layer 104 may collectively be referred to as a collector 110.

After the collector 110 is formed, the structure 100 undergoes an anneal process followed by an epitaxial growth of the base 106. The base 106 may be grown using similar techniques used to grow the first silicon layer 102 or the second silicon layer 104. The base 106 may be epitaxially grown to a thickness ranging between 20 nm to 200 nm. The base 106 may be made of silicon germanium. The germanium percentage in the base 106 may range from about 20% to about 40%.

The base 106 is also doped with a dopant that is opposite to the dopant in the collector 110. In an embodiment, the collector 110 is doped with an n-type dopant and the base 106 is doped with a p-type dopant. In an alternative embodiment, the collector 110 is doped with a p-type dopant and the base 106 is doped with an n-type dopant. Further, the collector 110 is made of different material than the base 106. In an embodiment, the collector 110 is made of silicon and the base 106 is made of silicon germanium.

With continued reference to FIG. 1, once the base 106 is grown, the emitter 108 is then grown on a top surface of the base 106. The emitter 108 may be grown using similar techniques used to grow the collector 110 or the base 106. The emitter 108 is in-situ doped with an n-type dopant, such as, for example, antimony, arsenic, or phosphorus. The emitter 108 may be made of silicon. In an embodiment, the emitter 108 is doped with the same type of dopant as the collector 110. Further, in an embodiment, the emitter 108 is doped with a different dopant than the base 106.

Figure 2:
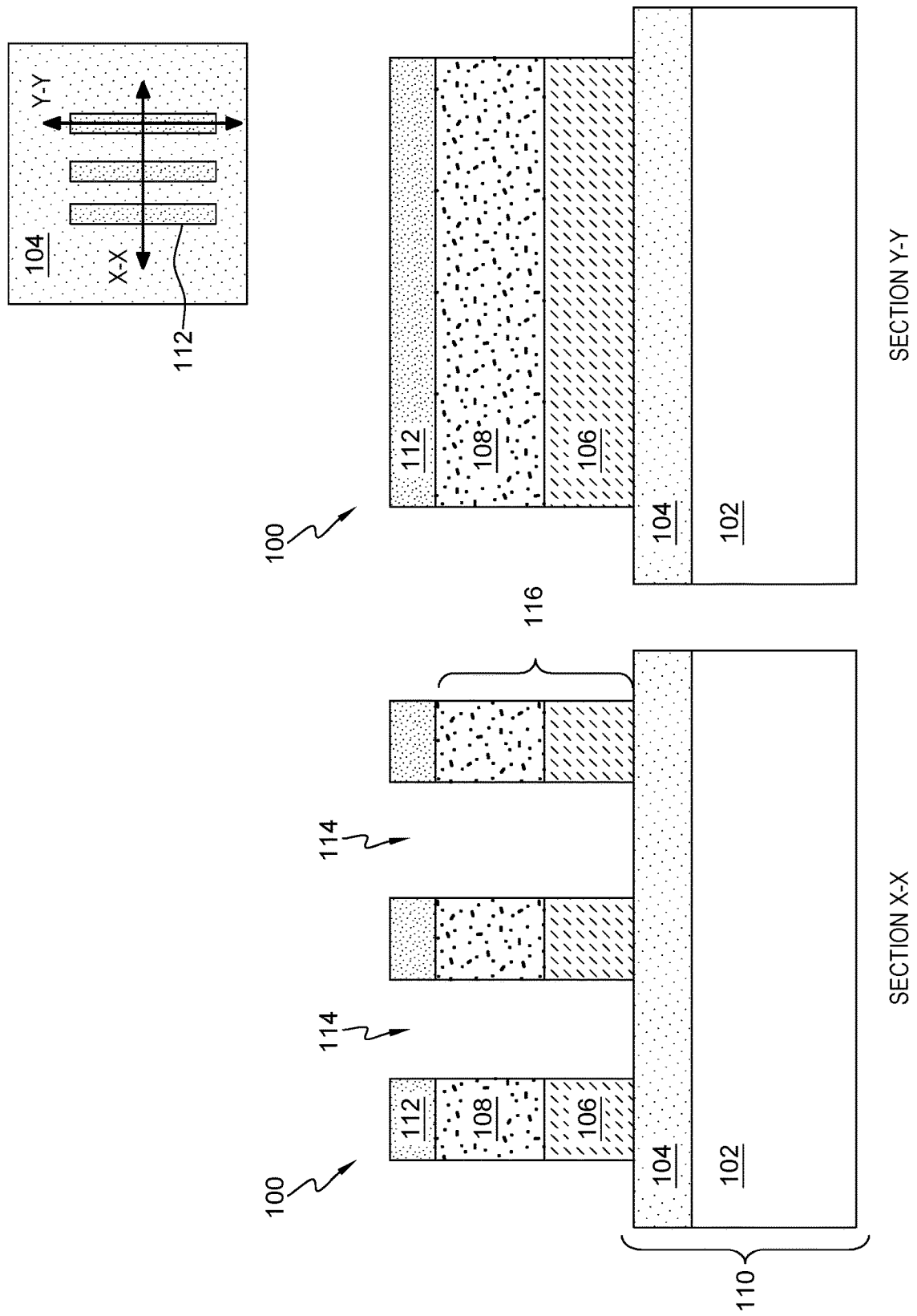
FIG. 2 is a cross section view, along sections X-X and Y-Y, illustrating fins and trenches formed to expose a top surface of the collector in accordance with an embodiment.

Referring now to FIG. 2, the structure 100 includes fins 116, in accordance with an embodiment. After the emitter 108 is grown, a hard mask layer (not shown) may be deposited on a top surface of the emitter 108. The hard mask layer may include any dielectric material such as, for example, silicon dioxide, silicon nitride, and/or silicon oxynitride. In some embodiments, the hard mask layer can be formed utilizing a conventional deposition process such as, for example, chemical vapor deposition, plasma enhanced chemical vapor deposition, or physical vapor deposition. In yet other embodiments, the hard mask layer can be formed by a combination of a deposition process and a thermal growth process. The hard mask layer may have a thickness ranging from approximately 10 nm to approximately 25 nm. Other thicknesses for the hard mask layer are possible and can be used in the present application.

After forming the hard mask layer on the top surface of the emitter 108, the hard mask layer is patterned (not shown). Patterning may be performed by lithography and etching. An etch process, such as, for example, a reactive ion etch (RIE) process may be performed to remove the emitter 108 and the base 106 until the top surface of the collector 110 is exposed. The patterning of the hard mask layer results in the formation of the hard mask cap 112, trenches 114, and the fins 116. The remaining portion, i.e., non-etched portion, of the hard mask layer is referred herein as the hard mask cap 112. The trenches 114 may extend through the top surface of the emitter 108 and the base 106, exposing the top surface of the collector 110. The fins 116 each include a pair of vertical sidewalls that are parallel or substantially parallel to each other. Although three fins 116 are described and illustrated as being formed, a single fin 116 or a plurality of fins 116 may be formed. Each fin 116 may extend from the top surface of the emitter 108 to the top surface of the collector 110.

Figure 3:
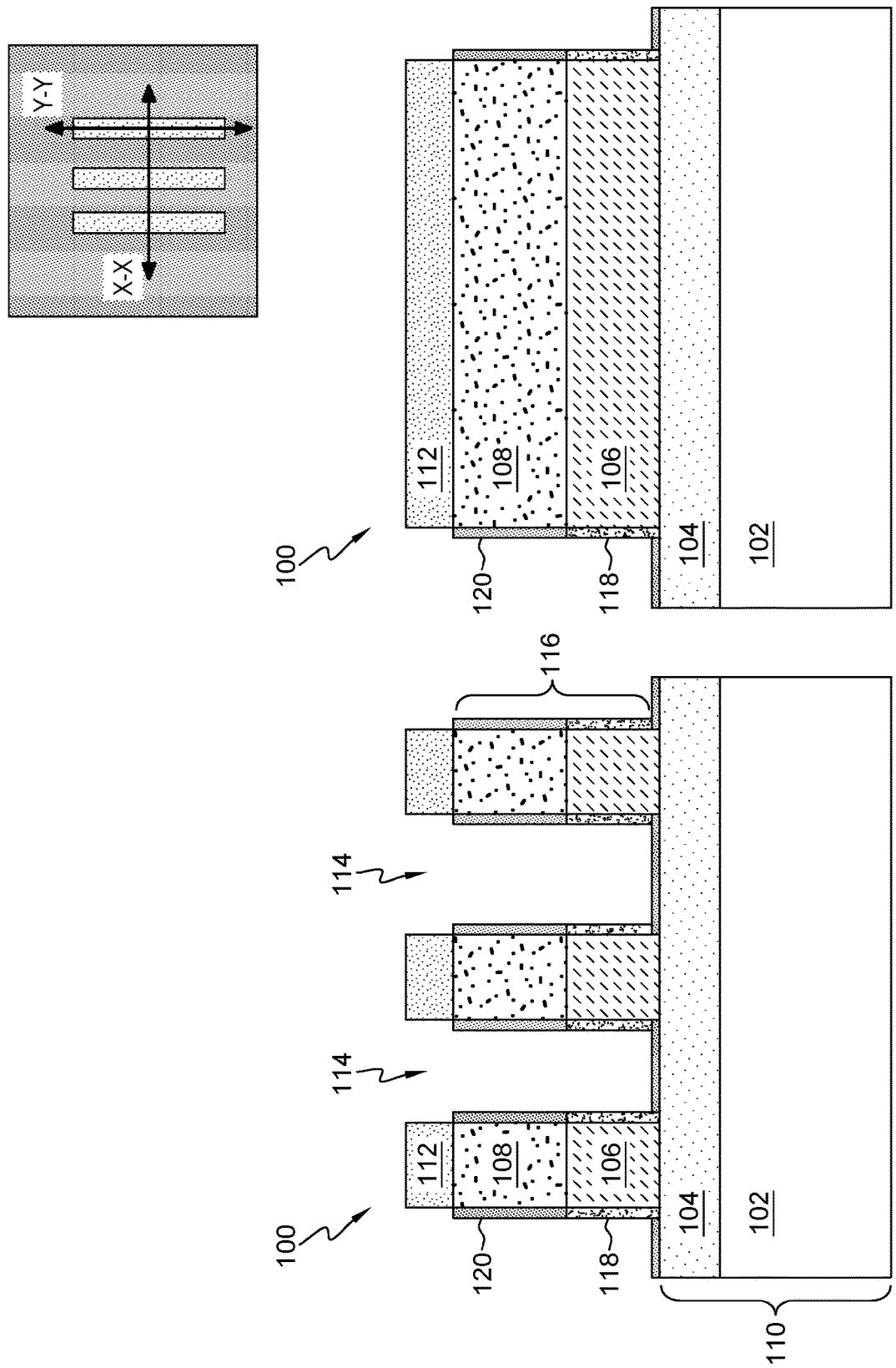
FIG. 3 is a cross section view along sections X-X and Y-Y, illustrating a silicon oxide layer and a silicon germanium oxide layer in accordance with an embodiment.

Referring now to FIG. 3, the structure 100 includes a silicon germanium oxide layer 118 and a silicon oxide layer 120, in accordance with an embodiment. After the fins 116 are formed, the structure 100 is oxidized. The oxidation may be performed using ozonated water (DIO3). The oxidation may also be performed by plasma oxidation process or other suitable oxidation processes. The oxidation causes the silicon germanium oxide layer 118 to form on all of the exposed silicon germanium surfaces. The oxidation also causes the silicon oxide layer 120 to form on all of the exposed silicon surfaces. As a result, the silicon germanium oxide layer 118 forms on the exposed sidewalls of the base 106, whereas the silicon oxide layer 120 forms on the exposed sidewalls of the emitter 108 and the top surface of the collector 110.

Figure 4:
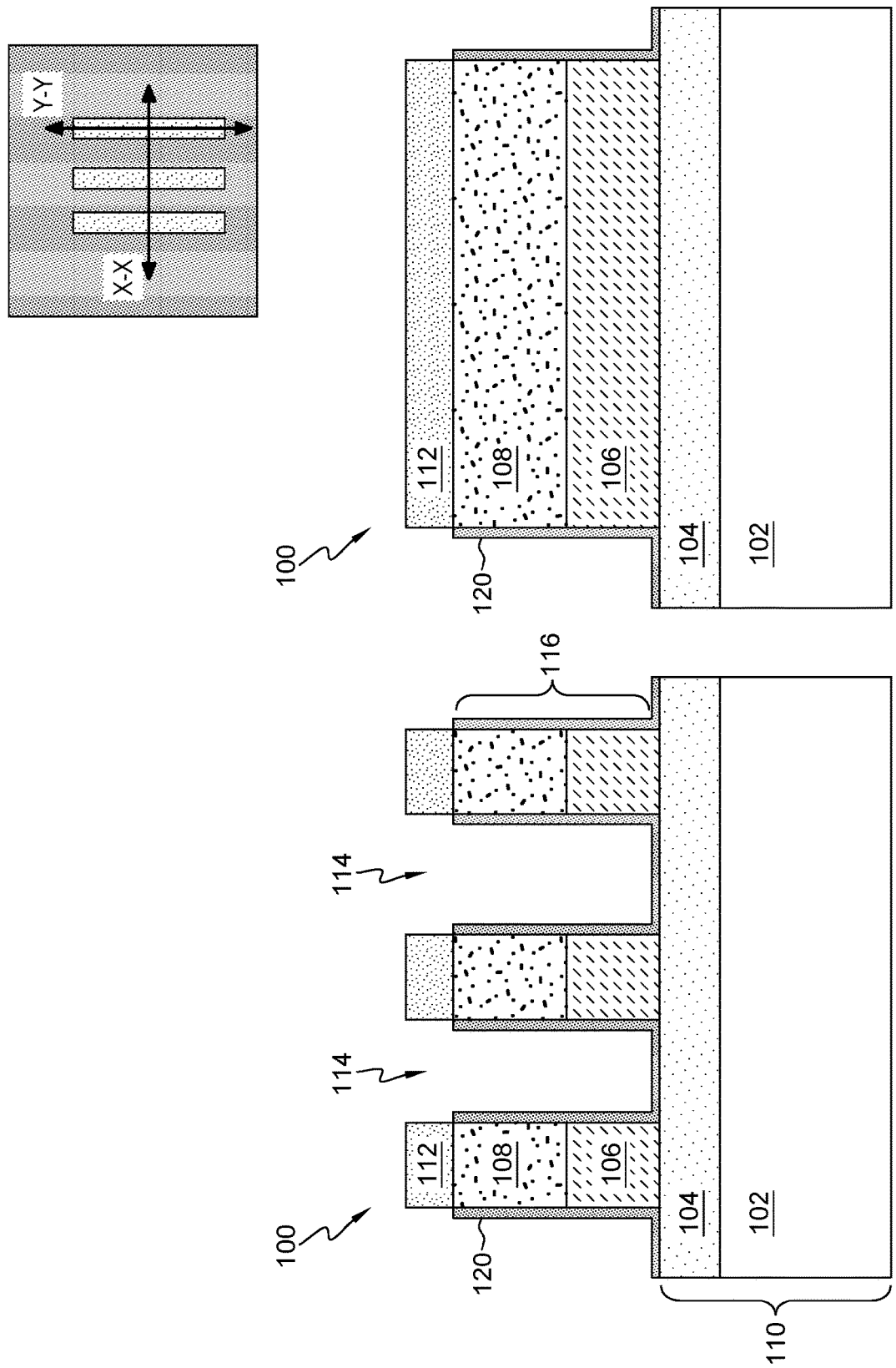
FIG. 4 is a cross section view along sections X-X and Y-Y, illustrating silicon oxide layer formed on a surface of the base in accordance with an embodiment.

Referring now to FIG. 4, the structure 100 includes the silicon oxide layer 120 on the exposed sidewalls of the base 106, in accordance with an embodiment. After the structure 100 is oxidized, the structure 100 is annealed. The structure 100 may be annealed using a hydrogen annealing process with temperatures ranging between 500° C. to 700° C. The anneal process scavenges the germanium oxide from the silicon germanium oxide layer 118 without damaging the silicon oxide layer 120 formed on the exposed silicon surfaces. The anneal process disrupts the germanium oxide bond such that the oxygen bonds with silicon forming the silicon oxide layer 120 on the base 106.

The anneal process breaks the silicon germanium oxide bonds and frees the oxygen from the silicon germanium oxide layer 118, allowing for the oxygen to bond with the silicon, forming the silicon oxide layer 120. Further, the remaining germanium is moved into the base 106, slightly increasing the amount of germanium in the base 106. Forming the silicon oxide layer 120 along the exposed sidewalls of the base 106 decreases the number of interface states between the base 106 and the surrounding dielectric fill. Without the silicon oxide layer, the leakage current may flow from the emitter 108 to the collector 110 using the interface states as leakage channel. Removing the interface states eliminates leakage currents. As such, the silicon oxide layer 120 prevents the formation of a direct interface between the base 106 and the ILD 124 which typically has a relatively high interface trap charge density. As a result, when the device is turned off, there is no leakage current flowing along those interface states. The silicon oxide layer 120 along the base 106 reduces interface trap densities at the base 106. The resultant structure 100 of FIG. 4 includes the silicon oxide layer 120 on top of the exposed sidewalls of the emitter 108, the base 106, as well as the top surface of the collector 110.

Figure 5:
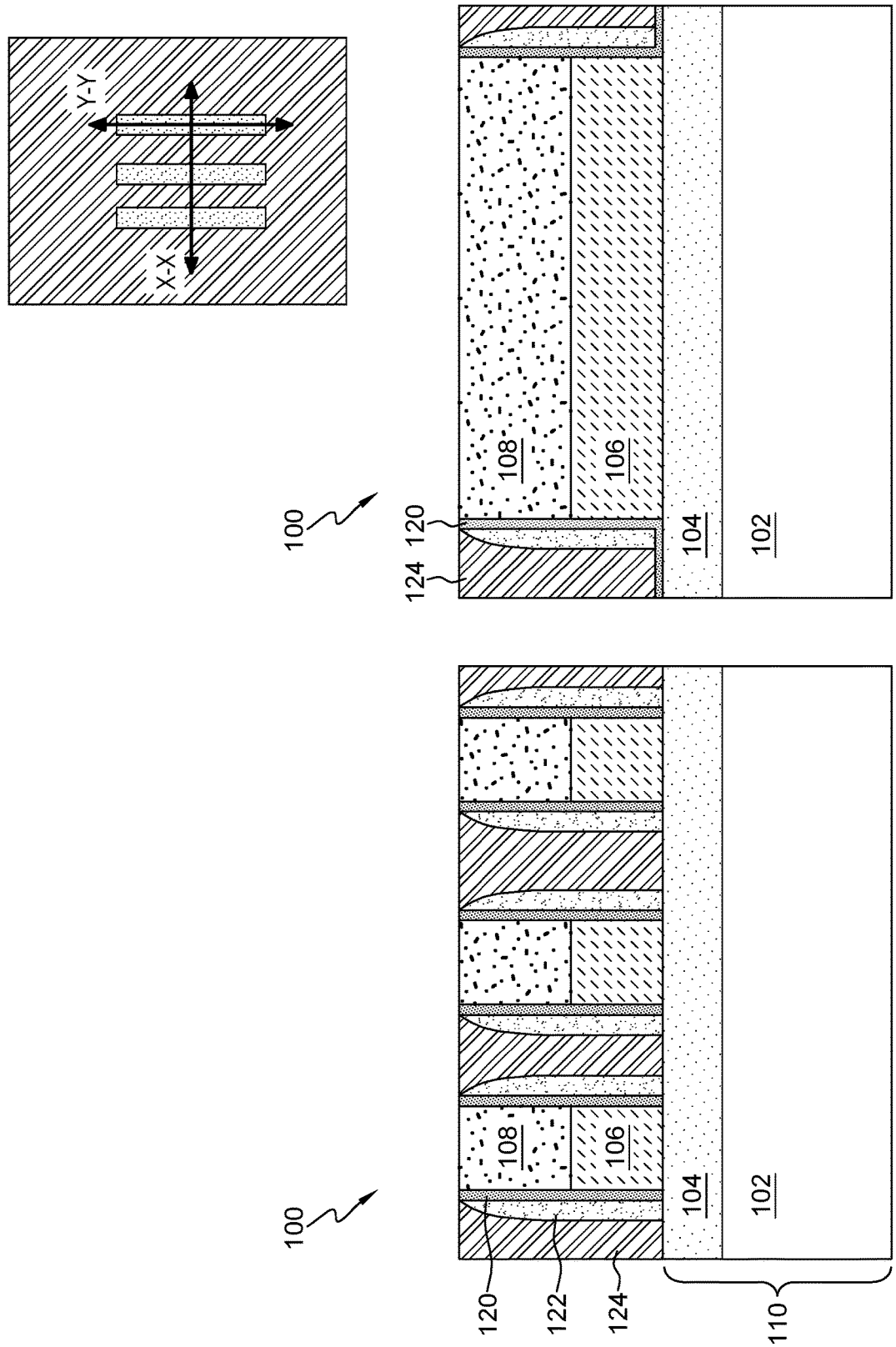
FIG. 5 is a cross section view along section X-X illustrating as spacers and an interlayer dielectric in accordance with an embodiment.

Referring now to FIG. 5, the structure 100 with spacers 122 and interlayer dielectric (ILD) 124 is shown, in accordance with an embodiment. A spacer material (not shown) may be conformally deposited onto the top surfaces of the silicon oxide layer 120 and the hard mask cap 112. The spacer material may include, but is not limited to, silicon nitride. A directional RIE process may then be used to form the spacers 122. The spacers 122 are on top of the silicon oxide layer 120 such that the silicon oxide layer 120 separates the spacers 122 from the base 106. The spacers 122 surround the fins 116, illustrated in FIG. 2, and protect the base 106 from the ILD 124.

Once the spacers 122 are formed, the ILD 124 is deposited such that the top surface of the ILD 124 is substantially flush with the top surface of the hard mask cap 112. The ILD 124 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The ILD 124 is deposited by a deposition process, including, but not limited to chemical vapor deposition, physical vapor deposition, plasma enhanced chemical vapor deposition, atomic layer deposition, evaporation, chemical solution deposition, or like processes.

After the ILD 124 is deposited, the structure 100 may undergo a planarization process, such as, for example, a chemical mechanical polish (CMP) process, may be used to remove excess ILD 124 and the hard mask cap 112 from the top surface of the structure 100. As a result, top surfaces of the emitter 108 are exposed.

Figure 6:
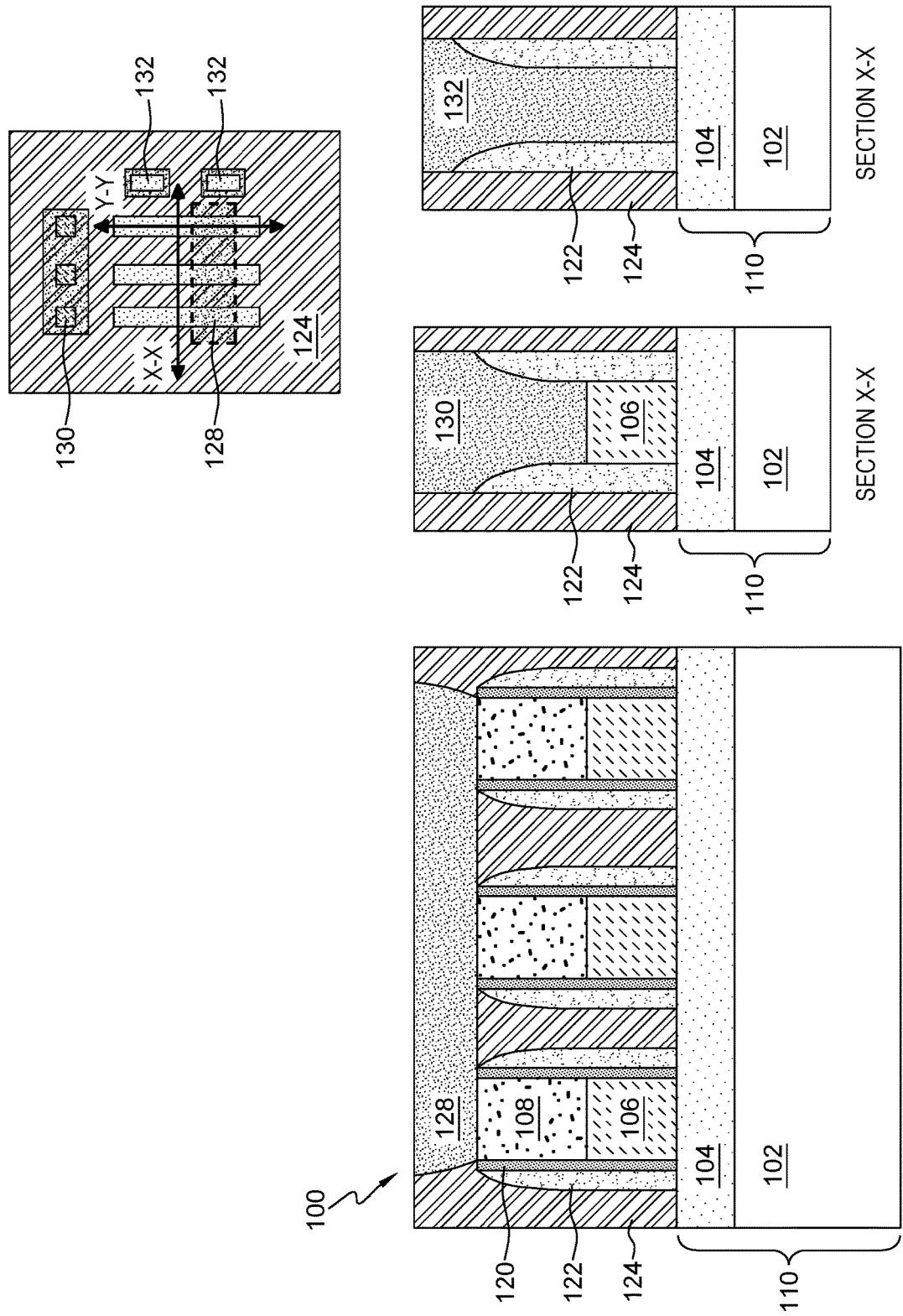
FIG. 6 are cross section views along section X-X illustrating contacts in accordance with an embodiment.

Referring now to FIG. 6, the structure 100 with contacts is shown, in accordance with an embodiment. The structure 100 includes an emitter contact 128, a base contact 130, and a collector contact 132. The emitter contact 128 is formed above and in direct contact with the emitter 108. The emitter contact 128 may be made of conductive metal, for example, copper (Cu), tungsten (W), or any combination thereof.

The base contact 130 extends from the surface of the ILD 124, through the emitter 108 to the base 106. The base contact 130 is formed by patterning a trench in the ILD 124.

To remove the ILD 124 and the emitter 108 and form the base contact trench, a resist, such as a photoresist, may be deposited and patterned. An etch process, such as a RIE, may be performed using the patterned resist as an etch mask to remove the ILD 124 and the emitter 108 until the base 106 is exposed. The base contact trench is filled with a conductive material or a combination of conductive materials to form the base contact 130. The conductive material may be a conductive metal, for example, copper (Cu), tungsten (W), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the ILD 124.

The collector contact 132 extends through the ILD 124 to the collector 110 and is formed within a trench. To remove the ILD 124 and form the collector contact trench, a resist, such as a photoresist, may be deposited and patterned. An etch process, such as a RIE, may be performed using the patterned resist as an etch mask to remove the ILD 124 until the collector 110 is exposed. The collector contact trench is filled with a conductive material or a combination of conductive materials to form the collector contact 132. The conductive material filling may be a conductive metal, for example, copper (Cu), tungsten (W), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the second ILD 124.

The resultant structure 100, as illustrated in FIG. 6, includes a HBT with the silicon oxide layer 120 along the sidewalls of the base 106, the emitter 108, and the top surface of the collector 110.

Another embodiment by which to fabricate the HBT with a silicon oxide layer on a silicon-germanium base is described in detail below by referring to the accompanying drawings FIGS. 1-6. In the present embodiment, a high-quality interface at the SiGe base is provided by depositing or growing a silicon epitaxy layer onto the SiGe base followed by chemical oxidation of the silicon epitaxy layer.

Figure 7:
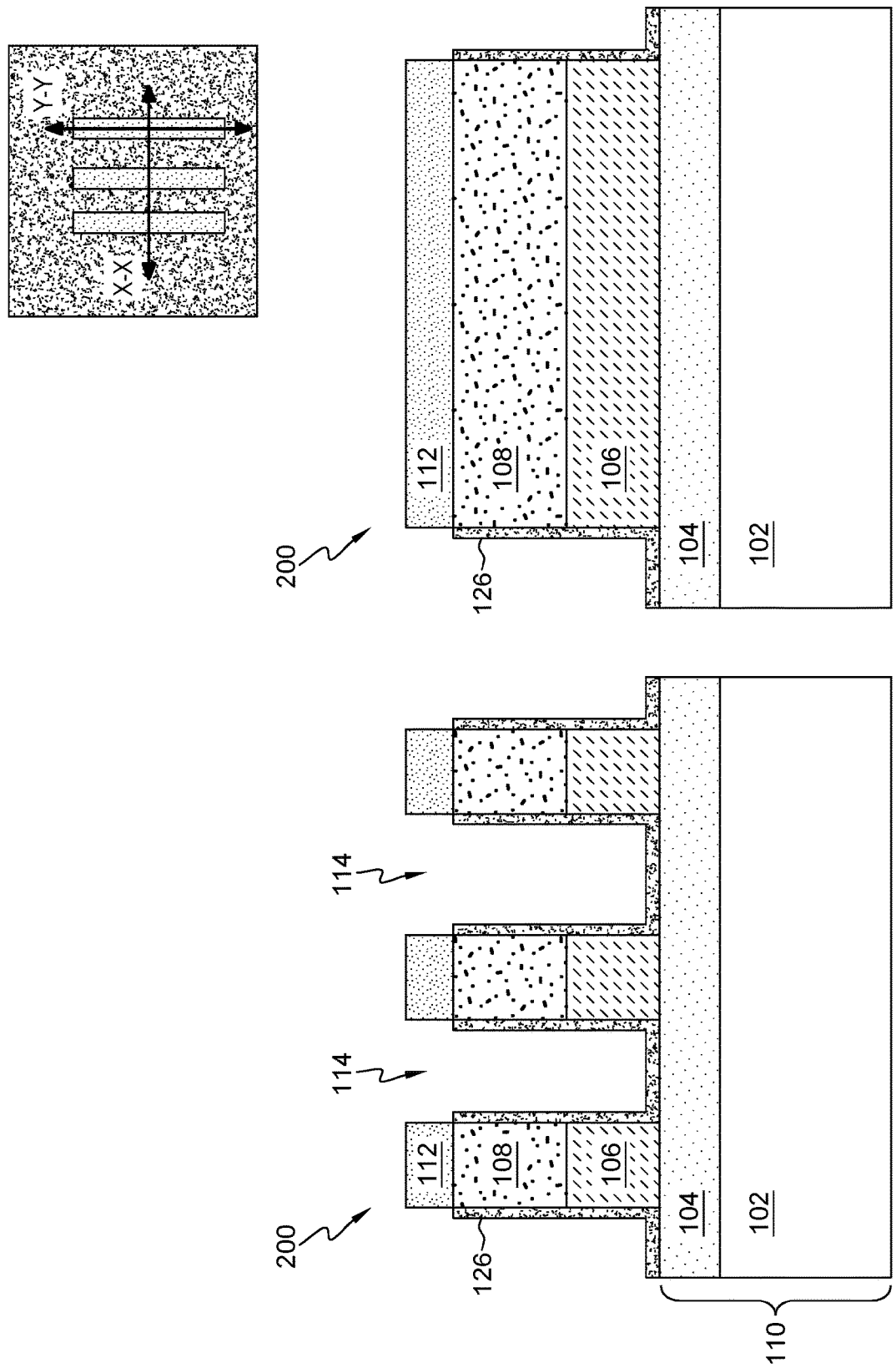
FIG. 7 is a cross section view along sections X-X and Y-Y, illustrating forming a silicon epitaxy layer in accordance with an embodiment.

Referring now to FIG. 7, a structure 200 is shown at an intermediate step of fabrication after forming the fins 116 (as described above with respect to FIG. 2), in accordance with an embodiment of the present invention. The structure 200 may be substantially similar in all respects to the structure 100 described in detail above with respect to FIG. 2; however, in the present embodiment, the structure 200 undergoes a silicon passivation process after the fins 116 are formed.

Beginning with the structure 100 of FIG. 2, an epitaxy layer 126 is epitaxially grown on the exposed sidewalls of the base 106, the emitter 108, and the top surface of the collector 110. The epitaxy layer 126 may be made of silicon and may be grown using a suitable growth process, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes. The epitaxy layer 126 may be grown to a thickness of about 1-2 nm. The epitaxy layer 126 acts as a passivation layer, protecting the base 106 from oxidizing when exposed to air. In an embodiment, the epitaxy layer 126 may also be conformally deposited along the top surface of structure 200.

Figure 8:
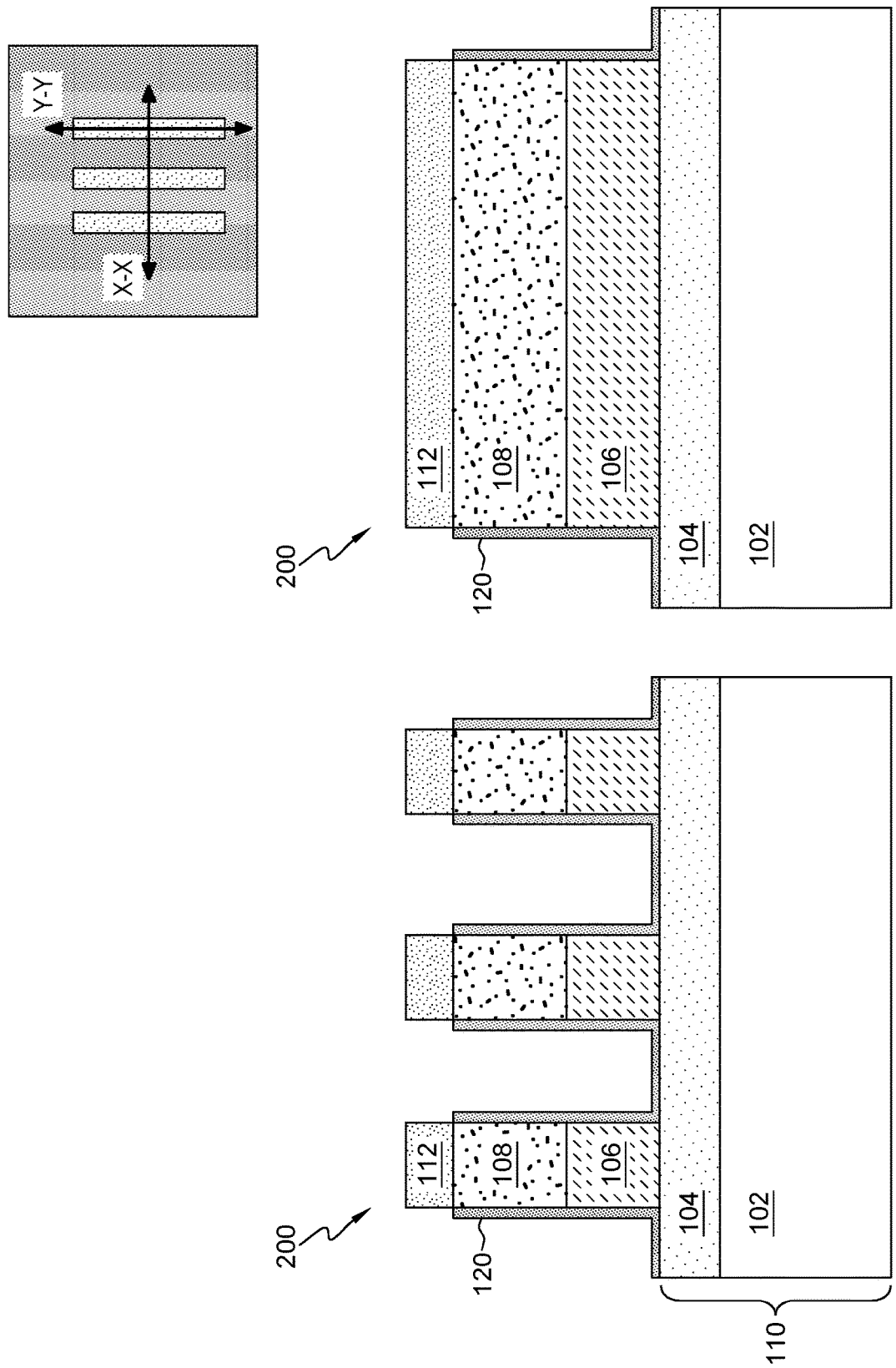
FIG. 8 is a cross section view along sections X-X and Y-Y, illustrating forming the silicon oxide layer on the fins in accordance with an embodiment.

Referring now to FIG. 8, the epitaxy layer 126 undergoes a chemical oxidation process to form the silicon oxide layer 120. Standard Cleaning 1—(ammonia hydroxide-hydrogen peroxide water mixture) may be used to chemically oxidize the epitaxy layer 126. As a result, the epitaxy layer 126 transforms into the silicon oxide layer 120 because the silicon in the epitaxy layer 126 bonds with oxygen during the chemical oxidation process. The resultant structure 200 is the same or substantially the same as the structure 100 illustrated in FIG. 4 because both structure 100 and structure 200 include the silicon oxide layer 120 along the sidewalls of the fins 116, including the sidewalls of the base 106. Once the silicon oxide layer 120 is formed on the structure 200, the manufacturing process continues, as described above with reference to FIGS. 5-7.

Having the base 106 surrounded by the silicon oxide layer 120 provides a heterojunction bipolar transistor that has a high-quality interface at the base 106. Since the base 106 is not in direct contact with the ILD 124, there is no interface between the base 106 and the ILD 124. As a result, there are no surface-state currents occurring even when the device is turned off.

Embodiments of the present invention provide a structure and a method of forming the silicon oxide layer 120 such that no silicon germanium oxide layer exists between the base 106 and the silicon oxide layer 120. Further, improvements at the base 106 interface provides low leakage current in the HBT. In addition, the HBT structure enables lateral and vertical scaling that may be used to achieve smaller and faster SiGe HBT devices with greatly increased current densities. This may induce high current and high speed or mobility of the device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A heterojunction bipolar transistor comprising:
    a base epitaxially grown on a collector;
    an emitter epitaxially grown on the base, the emitter and the base being patterned into a fin; and
    an epitaxy layer epitaxially grown on sidewalls of the fin, the epitaxy layer is made of silicon.

2. The heterojunction bipolar transistor of claim 1, wherein the epitaxy layer is formed into a silicon oxide layer.

3. The heterojunction bipolar transistor of claim 1, wherein the base is made of silicon germanium.

4. The heterojunction bipolar transistor of claim 1, wherein the emitter and the collector are made of silicon.

5. The heterojunction bipolar transistor of claim 1, wherein the base is doped with a p-type dopant.

6. The heterojunction bipolar transistor of claim 1, wherein the emitter and the collector are doped with a n-type dopant.

7. A method of forming a heterojunction bipolar transistor, the method comprising:
- epitaxially growing a base on a collector;
- epitaxially growing an emitter on the base, the emitter and the base being patterned into a fin; and
- epitaxially growing an epitaxy layer on sidewalls of the fin, the epitaxy layer is made of silicon.

8. The method of forming a heterojunction bipolar transistor of claim 7, further comprising:
- chemically oxidizing the epitaxy layer to form a silicon oxide layer;
- forming spacers on top of the silicon oxide layer; and
- depositing an interlayer dielectric on top of the spacers.

9. The method of forming a heterojunction bipolar transistor of claim 7, wherein the base is made of silicon germanium.

10. The method of forming a heterojunction bipolar transistor of claim 7, wherein the emitter and the collector are made of silicon.

11. The method of forming a heterojunction bipolar transistor of claim 7, wherein the base is doped with a p-type dopant.

12. The method of forming a heterojunction bipolar transistor of claim 7, wherein the emitter and the collector are doped with a n-type dopant.

* * * * *